United States Patent [19]

Inaba et al.

[11] Patent Number: 4,521,681

[45] Date of Patent: Jun. 4, 1985

[54] OPTICAL FUNCTION SEMICONDUCTOR DEVICE

[75] Inventors: Humio Inaba; Hiromasa Ito; Yoh Ogawa, all of Sendai, Japan

[73] Assignee: Tohoku University, Sendai, Japan

[21] Appl. No.: 381,842

[22] Filed: May 24, 1982

[30] Foreign Application Priority Data

Nov. 25, 1981 [JP] Japan .................................. 56-187689

[51] Int. Cl.³ ................................................. G01J 1/32
[52] U.S. Cl. ................................. 250/205; 250/213 A; 455/601
[58] Field of Search ................... 250/551, 205, 214 R, 250/206, 213 A; 455/601, 602; 357/19; 365/215, 234; 364/713, 822, 837, 845, 846

[56] References Cited

U.S. PATENT DOCUMENTS

| | | | |
|---|---|---|---|
| 3,471,700 | 10/1969 | Presti | 250/205 |
| 3,872,300 | 3/1975 | Vul et al. | 250/205 |
| 4,032,777 | 6/1977 | McCaled | 250/205 |
| 4,074,143 | 2/1978 | Rokos | 250/205 |
| 4,300,211 | 11/1981 | Hudson | 250/205 |
| 4,399,448 | 8/1983 | Copeland | 357/19 |

Primary Examiner—David C. Nelms
Attorney, Agent, or Firm—Fleit, Jacobson, Cohn & Price

[57] ABSTRACT

An optical function semiconductor device formed by opto-electrical loop coupling of a light emitting diode and a photodetector, the latter of which receives a part of an output light of the former controlled by an output current thereof, can be readily miniaturized and integrated as a fundamental function active device self-containing a light source and presenting various useful novel functions of the optoelectronic technology between the external input and the output lights.

7 Claims, 22 Drawing Figures

OPTICAL FUNCTION SEMICONDUCTOR DEVICE

BACKGROUND OF THE INVENTION

(1) Field of the Invention

The present invention relates to an optical function semiconductor device provided with a semiconductor light emitting diode for presenting various functions between an input light and an output light thereof, particularly, so as to realize an optical function device which can be readily miniaturized and integrated and further furnishes a basis for the optoelectronics.

(2) Description of the Prior Art

In the field of optical industrial techniques including the optical communication, the optical information transmission, the optical data processing system and the like, various kinds of semiconductor devices which utilize the electro-optical effect and the acousto-optical effect for the high speed control of the light have been developed hitherto. However, most of these conventional optical function semiconductor devices are arranged for controlling the light passing therethrough by an electric voltage or an electric current applied to an element presenting the electro-optical effect or the acoustical-optical effect, so that these conventional devices cannot be regarded as a genuine optical device which is operated in the situation between an input light and an output light.

On the other hand, a bistable optical element, that is, a so-called BOD, which has been vigorously developed recently, is known as a kind of optical function device. This BOD is a new light input to light output device of high speed operation and low power consumption which is arranged for being controlled by feeding back an electric voltage or an electric current thereto, which is proportional to an output light intensity thereof obtained in a situation where it is used as an optical switch, an optical modulator or the like. Accordingly, this BOD is intended to be utilized for an optical differentiating amplifier, an optical switch, an optical limiter, an optical pulse shaper, an optical memory, an optical operator and the like, and hence has been already developed in various forms such as a Fabry-Perot resonator of genuine type including a nonlinear medium or an optical modulator of hybrid type which is controlled by electrically feeding back. However, all of these conventional bistable optical devices are no more than passive elements containing no light source which is indispensable for the operation thereof, so that is is an indispensable condition to be combined with an external light source. Consequently, these conventional optical function semiconductor devices have a significant essential defect which impedes the miniaturization, the simplification and the integration as the most requirement for practical use of the optical function device of this kind.

As a drastic remedy for the above defect of the conventional bistable optical device, the present inventors proposed a laser functional device by U.S. patent application Ser. No. 361,816, which device included a semiconductor laser element as a light source and was effected the bistable operation under the combination with an opto-electrical converting element. In relation thereto, the semiconductor laser has recently made a rapid progress and the performance thereof has been remarkably improved. As a result, it is provided with favorable benefits such as it is ready to be formed as an extremely minuscule laser element and to be excited by an electric current and further to be integrated in combination with another electronic or optical device. However, on the other hand, it is also provided with various difficulties in practical use such as the range of the wavelength of the emitted light and hence an arbitrary wavelength are difficult to be set up, the structure thereof is comparatively complicated and hence it is not so easy to fabricate it with a low cost.

SUMMARY OF THE INVENTION

An object of the present invention is to provide an optical function semiconductor device from which the above mentioned defects are removed.

Another object of the present invention is to provide an optical function semiconductor device containing a light source which is indispensable for an optical function device and presenting various functions between an input light and an output light.

Still another object of the present invention is to provide an optical function semiconductor device which is facilitated to be miniaturized and integrated and can be fabricated with low cost.

According to the present invention, the light source being the most suitable for attaining the above objects consists of, as a substitute for the semiconductor laser element having the above difficulties, a light emitting diode of, for instance, junction type, which, although being inferior to the semiconductor laser element in respect to the response speed, has a plenty of kinds, a wide range of usable wavelength, a simple and extremely minuscule structure facilitating the low cost manufacture, a controllability of operation under the current injection and a superiority to the semiconductor laser element in respect to the integration and the life.

An optical function semiconductor device according to the present invention is realized as an optical function element which presents the same various functions as those of various kinds of conventional function devices of electronic technology which have been developed and widely employed in practical use.

The optical function semiconductor device according to the present invention is given with an abbreviated name BILED (Bistable Light Emitting Diode) corresponding to BILD (Bistable Laser Diode) which is given to the aforesaid laser functional device, and is formed of an electrical series connection of a light emitting diode and a photo-detector, the latter being injected with a light emitted from the former together with an external input light so as to present an optical bistability between those input and output lights for giving two stable states to the output light in a predetermined range of the input light intensity.

The feature thereof is that a light emitting diode and an opto-electrical converting element, both of which are formed of semiconductors are circularly interconnected optically and electrically, the former being controlled by the electric output signal of the latter which is generated in response to the injection of at least the output light of the former, so as to vary the output light for providing a desired function.

The above optical function semiconductor device presenting the optical bistability corresponds to an electric function device utilizing a bistability between an input and an output voltages or currents, which device furnishes a basis for ordinary electronics circuits, for instance, a digital circuit, a pulse circuit and the like, so that it can be regarded as the most basic and novel optical device.

According to the above mentioned configuration, an extremely minuscule genuine optical function device can be realized, for instance, by integrating a whole electronic circuit consisting of the light emitting circuit, the photodetector and other elements accompanying thereto.

BRIEF DESCRIPTION OF THE DRAWINGS

For the better understanding of the invention, reference is made to the accompanying drawings, in which.

DESCRIPTION OF THE PREFERRED EMBODIMENTS

Figure 1:
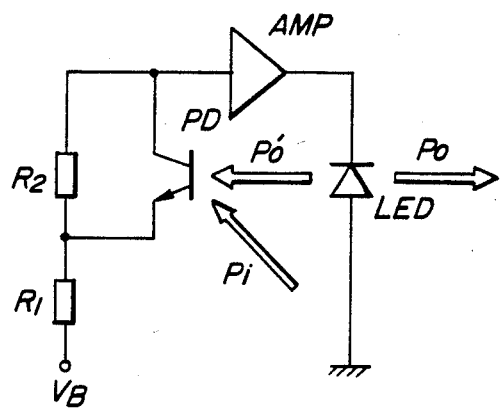
FIG. 1 is a circuit diagram showing an example of a basic configuration of an optical function semiconductor device according to the present invention.

An example of a basic configuration of an optical function semiconductor device according to the present invention is shown in FIG. 1. In this configuration, LED and PD denote a light emitting diode and a photo-detector respectively, Po denotes an output light of the light emitting diode LED, and Pi denotes an external light inputted or injected into the photo-detector PD. So that, according to this configuration, a portion of P'o of the output light Po of the light emitting diode LED, which has been previously converted opto-electrically and passed through an amplifier AMP or the controlling semiconductor means inserted as occasion demands, is positively fed back to the light emitting diode LED itself. Light P'o is the internal incidence of a portion of light Po on the photo-detector PD. In addition, VB denotes an operation voltage to be applied respectively to each elements in the configuration, and $R_1$, $R_2$ denote a resistor network regulating a bias voltage and a feedback rate for both of elements LED and PD. The photo-detector PD contains a wide band amplifying element as occasion demands. The external light injected into the photo-detector PD can be formed of either a coherent light as emitted from a laser oscillator or an incoherent light as emitted from an ordinary light source.

The principle of operation for obtaining the aforesaid optical bistability of the optical function semiconductor device according to the present invention, which consists of the optical and electrical circular interconnection between the light emitting diode LED and the photo-detector PD, can be considered as that a hysteresis performance is induced between the light input and light output on the base of co-operative relation between those elements LED and PD, since the non-linearity is given to the light input and output to current performance of the device by the light emitting performance of the element LED and the saturation performance of the element PD. In the situation where various operating points can be setup on the basis of the combination of parameters of the feedback control system consisting of the aforesaid optical and electrical circular interconnection, various kinds of operation modes of, for instance, an optical limiter performance and an optical differential gain performance can be realized in addition to the above hysteresis performance, so that, as mentioned earlier, the same various functions as of the conventional electronic circuits can be maintained.

Moreover, both of sizes of the light emitting diode LED and the photo-detector PD are extremely minuscule, that is, hundreds microns long and a few or scores microns wide, and hence very suitable for integrating as of monolithic or hybrid type. Accordingly, it is possible to unify the whole circular connection system including these elements LED and PD and other electronic elements accompanying thereto on a single base and further to hold various kinds of novel functions between the light input and the light output of the device which is composed of various combinations or arrays of those unified systems, so as to realize one of the most basic optical circuit element of the optoelectronic technology.

Figure 2:
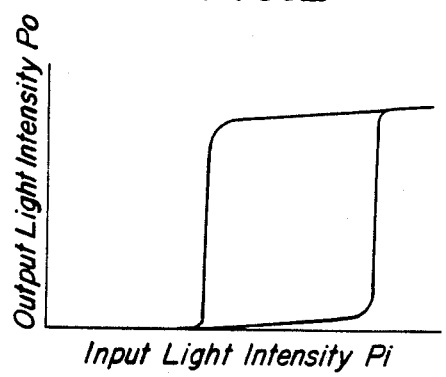
FIG. 2 is a characteristic curve showing an example of an input and output light bistability performance of the same.

In a situation where the output light intensity of the light emitting diode LED is substantially proportional to the square of the exciting current intensity and the photo-current of the photo-detector PD has the saturation performance in the configuration as shown in FIG. 1, it can be easily comprehended under the simple consideration that the light input to output performance (Pi-Po) presents the hysteresis or the differential gain. An example of the light input to output performance which is practically measured by an X-Y recorder is shown in FIG. 2 in a situation where a photo-transistor is employed for the photo-detector PD and the feedback rate is controlled, so as to obtain the differential gain performance as well as the hysteresis performance as shown in FIG. 2.

Figure 3:
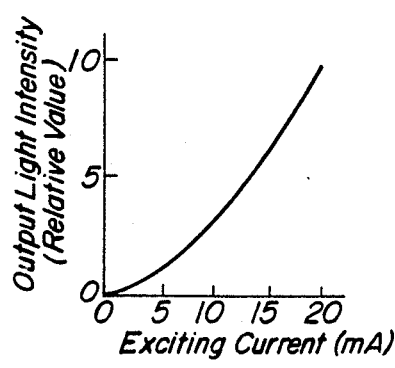
FIG. 3 is a characteristic curve showing an example of a current to light performance of a light emitting diode in the same.
Figure 4:
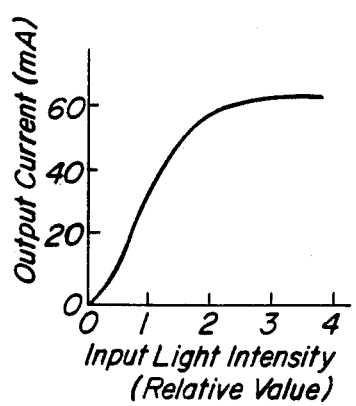
FIG. 4 is a characteristic curve showing an example of a light to current performance of an optical detecting element in the same.

In addition thereto, an example of the current to light performance of the light emitting diode LED which is measured at the same time as the above is shown in FIG. 3, and an example of the light to current performance of the photo-transistor employed for the photo-detector PD is shown in FIG. 4. Although the response time of the device is in order of hundreds micro seconds because of the photo-transistor employed for the photo-detector PD, it can be expected to realize an extremely high speed response by employing, for instance, an avalanche photo-diode.

Figure 5:
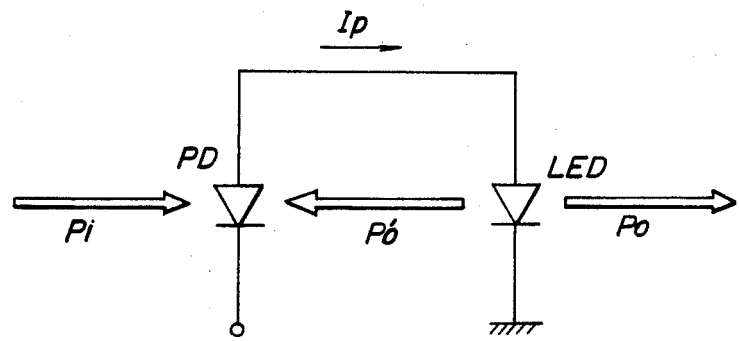
FIG. 5 is a circuit diagram showing another example of the basic configuration of the same.

Next, the most basic configuration of the optical function semiconductor diode BILED according to the present invention is shown in FIG. 5 and performances of the whole device and each elements thereof are shown in FIGS. 6(a) to 6(g) respectively.

Figure 6A:
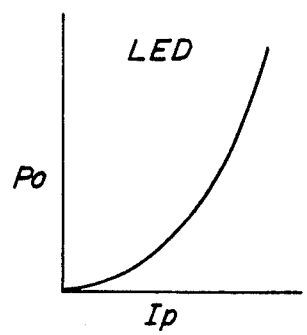
FIGS. 6(a), 6(b), 6(c), 6(d), 6(e), 6(f) and 6(g) are characteristic curves showing various kinds of performances of the same respectively.

In the basic configuration as shown in FIG. 5, the output light Po of the light emitting diode LED and the external light Pi are injected into the photo-detector PD, as well as the output current Ip of the photo-detector PD is injected into the light emitting diode LED as the exciting current thereof. In this configuration, the current to light performance (Ip-Po) of the light emitting diode LED becomes as shown in FIG. 6(a), so that the output light intensity Po of the light emitting diode LED is proportional to the square of the exciting current Ip, the proportional constant "a" thereof being expressed by the following equation.

$$Po = aIp^2$$

Figure 6B:
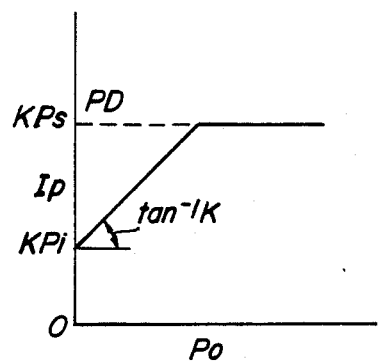

On the other hand, the light to current performance (Po-Ip) becomes as shown in FIG. 6(b), so that, in a range of the whole input light intensity being lower than a threshold level Ps which is determined by the kind of the element PD and the operational condition thereof, the output current intensity Ip of the photo-detector PD is proportional to the whole input light intensity (Pi+Po), the proportional constant "k" thereof being expressed by the following equation.

$$Ip = k(Pi + Po) [Pi + Po < Ps]$$

In addition, in the range of the whole input light intensity being higher than the threshold level Ps, the output current intensity Ip of the photo-detector PD reaches to a constant saturation current intensity kPs and can be expressed by the following equation.

$$Ip = kPs [Ps < Pi + Po]$$

Figure 6C:
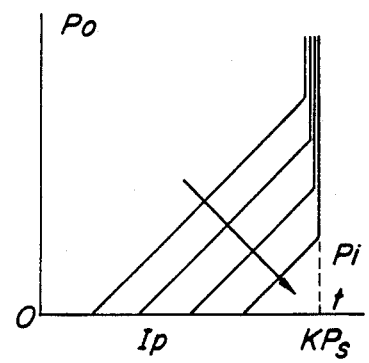
Figure 6D:
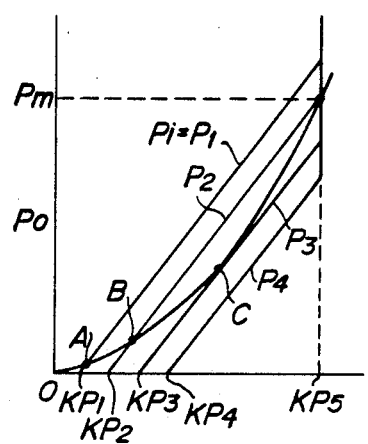

The light to current performance (Po-Ip) of the photo-detector PD as shown in FIG. 6(b) can be redrawn as shown in FIG. 6(c) on the abscissa representing the exciting current intensity Ip and on the ordinate representing the output light intensity Po such as it is shown on the same coordinates as the current to light performance (Ip-Po) of the light emitting diode LED as shown in FIG. 6(a), so that the portion of the characteristic curve, which portion represents the proportional relation between the whole input light intensity and the output current intensity, can be parallelly shifted in the direction as shown by an arrow mark when the intensity of the external light Pi is increased. Besides, the current to light performance (Ip-Po) of the light emitting diode LED as shown in FIG. 6(a) and the light to current performance (Po-Ip) of the photo-detector PD as shown in FIG. 6(c) can be shown on the same coordinates as shown in FIG. 6(d), so that respective cross-points A, B, C and D between the current to light characteristic curve of the light emitting diode LED and respective characteristic curves representing the light to current performances of the photo-detector PD when the external light intensity Pi is increased successively from $P_1$ to $P_4$ indicate successive operation points of the optical function device according to the present invention comprised as shown in FIG. 5. That is to say, in a situation where the external light intensity Pi is successively increased as shown by $P_1 \rightarrow P_2 \rightarrow P_3$, the operation point of the device is successively shifted as shown by A→B→C, and in another situation where the external light intensity Pi is further increased, the operation point of the device jumps from the point C to the point D and is maintained at this point D in spite of the further increase of the external light intensity Pi thereafter.

In contrast thereto, in a situation where the external light intensity Pi is decreased contrarily to the above situations, the operation point of the device jumps from the point D to the point B at the external light intensity $Pi = P_2$ at which the current to light characteristic curve of the light emitting diode LED and the light to current characteristic curve of the photo-detector PD are intersected at the operation point D, and returns to the origin "O" of the coordinates through the point A. The behavior of the shift of the operation point as shown in FIG. 6(d) can be redrawn in a form of the light input to output performance of the device on the abscissa representing the external light intensity Pi varied as the controlling input and on the ordinate representing the output light intensity Po as the output of the device which is varied by the shift of the operation point based on the variation of the external light intensity Pi, as shown in FIG. 6(e), so that, when the external light intensity Pi reaches the value $P_3$, the operation point of the device jumps from the point C to the point D and the output of the device is maintained constantly at the saturated output light intensity Pm thereafter.

Figure 6E:
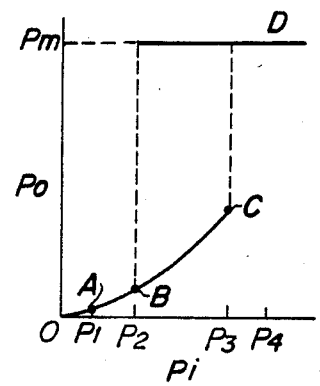

In contrast thereto, when the external light intensity Pi is decreased to the value $P_2$, the operation point of the device jumps from the point D to the point B representing the state of the low output light intensity, so that the hysteresis performance as shown in FIG. 6(e) can be obtained.

Figure 6F:
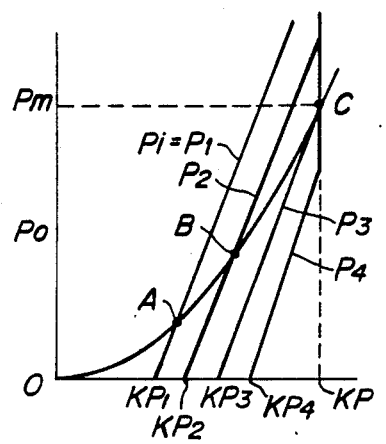
Figure 6G:
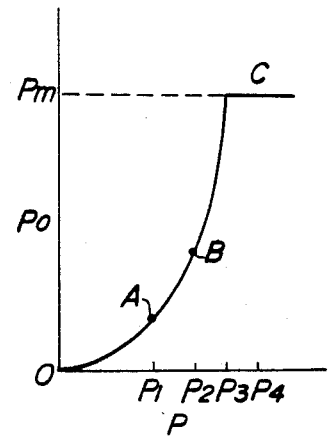

On the other hand, in a situation where the value of the proportional constant "k" of the exciting current Ip=k(Pi+Po) consisting in the current to light performance of the device is setup smaller than as shown in FIG. 6(e), the current to light performance of the device becomes as shown in FIG. 6(f), and further, in a situation where this behavior of operation is redrawn similarly as mentioned above, the light input to output performance of the device is varied as shown in FIG. 6(g), and as a result, the hysteresis performance thereof disappears such as the inclination dPo(dPi of the tangent to the characteristic curve exceeds "1", when the external light intensity Pi is increased close to the value $P_3$ from the value $P_2$, so as to realize the differential gain performance as shown in FIG. 6(g). In addition thereto, in another situation where the proportional constant "k" of the exciting current Ip=k(Pi+Po) is not decreased as mentioned above, but the proportional constant "a" of the output light $Po = aIp^2$ is decreased, the differential gain performance can be also realized similarly as mentioned above.

Accordingly, whether the hysteresis performance as shown in FIG. 6(e) is presented or the differential gain performance as shown in FIG. 6(g) is decided in response to the produce "ak" of the above mentioned proportional constants "a" and "k".

Figure 7A:
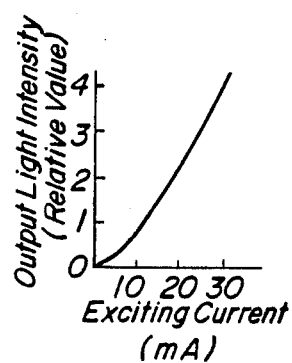
FIGS. 7(a) and 7(b) are characteristic curves showing examples of performances of the light emitting diode and the optical detecting element of the same respectively.
Figure 7B:
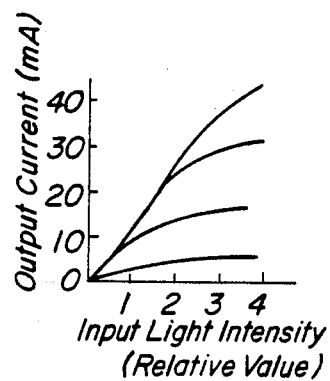
Figure 8:
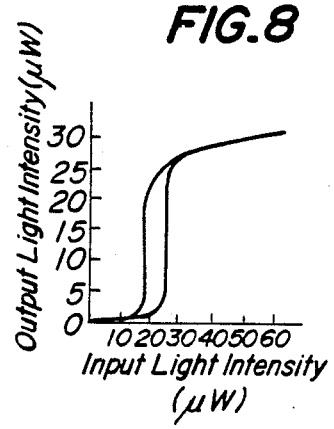
FIG. 8 is a characteristic curve showing an example of a light input to light output hysteresis performance of the same.

As mentioned above, the light input to output performance of the optical function device according to the present invention is based on the combination of the nonlinear current to light performance of the light emitting diode LED and the light to current saturation performance of the photo-detector PD. In connection therewith, measured examples of the current to light performance of the light emitting diode LED and the light to current performance of the photo-detector PD are shown in FIGS. 7(a) and 7(b) respectively, whilst a measured example of the light input to output hysteresis performance of the optically bistable light emitting diode BILED which is based on the combination of those performances is shown in FIG. 8. In relation to these drawings, a silicon photo-diode attached with a transistor arranged in a form of Darlington connection is employed for the photo-detector PD for increasing the optical detected output current, and further another light emitting diode which is sinusoidally modulated is employed for the controlling external light source required for realizing the light input to output hysteresis performance of the device, so that both of the input and output lights of the device consist of incoherent lights.

The response speed of the optically bistable light emitting diode BILED used for the above measurement is determined substantially in response to that of the photo-transistor employed for the photo-detector PD and hence becomes hundreds micro seconds. However, in a situation where a photo-detector having a sufficiently high response speed is employed and hence the response speed of the device is determined by direct modulation limits of each circuit elements, it can be expected to realize a high response speed in order of a dozen or so nanoseconds as mentioned earlier.

Figure 9:
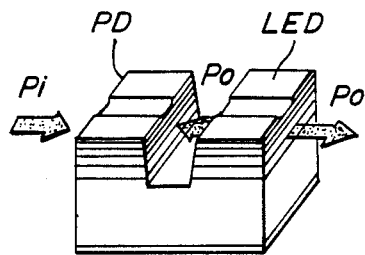
FIG. 9 is a perspective view showing an example of an integrated structure of the same.

In addition thereto, the optical function semiconductor device according to the present invention, that is, the aforesaid optically bistable light emitting diode BILED is originally conceived for the purpose of the optical integration of the device, and can be expected to exhibit various kinds of supreme functions. An example of the structure of the optical function semiconductor device which is manufactured under the above optical integration is shown in FIG. 9. As the most simple manufacturing method for the above shown device according to the present invention, firstly, a light emitting diode of conventional junction type is deposited on a whole surface of a semiconductor substrate SS and then a groove is formed thereon perpendicular to the light emitting direction by etching. Thereafter, one of two junction type diodes which face each other beyond this groove is operated as the light emitting diode LED, whilst the other thereof is operated as the detecting photo-diode PD. In this situation, the output light Po' of the light emitting diode LED and the external light Pi are injected into the detecting photo-diode PD simultaneously, as well as the output light Po emitted from the other side of the light emitting diode LED is derived as the output light of the device.

Next, typical examples of various kinds of function devices which can be realized by utilizing the light input to output performance of the optical function semiconductor device according to the present invention, which can be expected to exhibit various kinds of novel functions as mentioned above, will be enumerated as follows.

Figure 10:
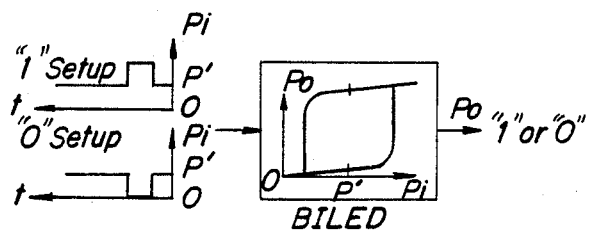
FIG. 10 is a diagram showing an example of an application of the same as an optical memory.

(1) An optical memory, an optical switch:

An optical memory and an optical switch can be realized by utilizing the light input and output hysteresis performance as shown in FIGS. 6(e) and 8. That is, as shown in FIG. 10, when the input light Pi of the device according to the present invention amounts to the value P', two stable states of the output light Po can be obtained, so that the output light Po reaches a stable state of high level "1" when a positive light pulse is added to the value P' of the input light Pi, whilst the output light Po reaches another stable state of low level "O" when a negative light pulse is added to the value P' of the input light Pi. Accordingly, this variation of state between these two stable states of "1" and "0" of the output light Po in response to the variation of the input light intensity Pi can be utilized for a digital memory or a logic switch.

Figure 11:
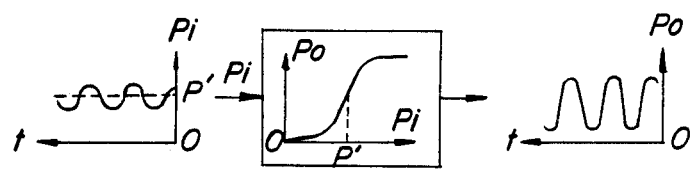
FIG. 11 is a diagram showing another example of the application of the same as an optical differential amplifying element.

(2) An optical differential amplifier:

In a situation where the light input to output gain performance as shown in FIG. 6(g) is presented, the device according to the present invention can be applied for an optical differential amplifier. That is, as shown in FIG. 11, when the input light Pi having an average level P' is amplitude-modulated by a minute amplitude, the output light Po formed by the amplification of the minute amplitude can be obtained. The differential amplification can be setup at any desired value by controlling the operating conditions of each elements.

Figure 12:
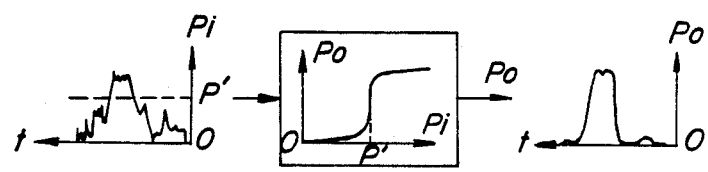
FIG. 12 is a diagram showing still another example of the application of the same as an optical pulse shaping element.

(3) An optical pulse shaper:

It is also possible to shape a waveform of an input light pulse by utilizing the light input to output differential gain performance being similar as shown in FIG. 6(g). That is, when an intensity of an input light Pi as shown in FIG. 12 exceeds a level P' as shown in FIG. 12, an output light Po is maintained substantially at a constant level, whilst, contrarily to the above, when the intensity of the output light Po does not reach the level P', the output light Po is maintained substantially at the zero level, so that, even if the waveform of the input light pulse is deformed, for instance, by the noise superimposed on the input light pulse the height of which exceeds the level P', the waveform of the output light pulse can be regularly shaped by compressing the irregularity caused by the noise. In addition, this pulse shaping can be effected together with the amplification of the pulse height and hence can be expected to be applied for an integrated high speed repeater in the optical communication.

Figure 13:
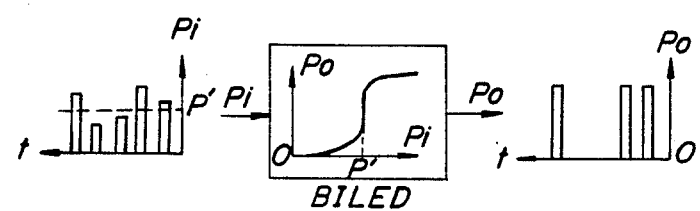
FIG. 13 is a diagram showing further another example of the application of the same as an optical pulse height comparing element.

(4) A light pulse height comparator (an optical comparator):

The device according to the present invention can be operated as a light pulse height comparator for comparing input pulses with each other, that is, an optical comparator by utilizing the light input to output differential gain performance being similar as described in the above item (3). That is, as shown in FIG. 13, in a situation where a group of input light pulses having various pulse heights is successively applied, output light pulses having a constant pulse height can be formed only in response to those input light pulses having pulse heights which exceed the level P' as shown in FIG. 13 respectively.

Figure 14:
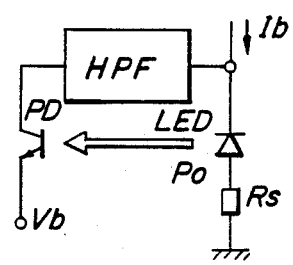
FIG. 14 is a diagram showing further another example of the application of the same as an optical regenerative oscillating element.

(5) An optical regenerative oscillator:

In a situation where an electrical feedback circuit used in the optically bistable light emitting diode according to the present invention is inserted with a filter for preventing the maintenance of the stable state, for instance, a high pass filter or a band pass filter, and then respective operating conditions of each circuit elements are appropriately controlled, a regenerative oscillation can be caused in a form of reciprocation between these two stable states. That is, as shown in FIG. 14, this regenerative oscillation can be realized by inserting the high pass filter HPF into the electrical feedback circuit provided between the light emitting diode LED and the photodetector PD consisting in the optically bistable light emitting diode according to the present invention. This regenerative oscillation can be caused in a situation where the optical function device presents the bistability and the loop differential gain at the bias point exceeds the value "1", and the oscillation frequency thereof is determined mainly by the cutoff frequency of the inserted high pass filter HPF, and further the inclinations of leading and trailing edges of the pulse waveform of the regenerative oscillation output light pulse, that is, the speeds thereof are determined in response to the response speed of the optical bistable device.

Figure 15:
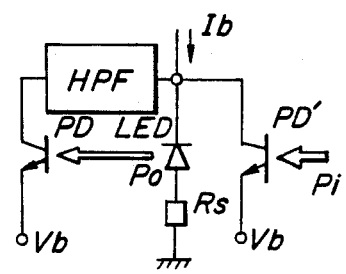
FIG. 15 is a circuit diagram showing an example of a configuration of an optical bistable light emitting diode according to the present invention.

In addition to the above, an example of the configuration of the optically bistable light emitting diode according to the present invention, in a situation where the start and the stop of the above-mentioned regenerative oscillation are controlled by the on-off of the external input light Pi, is shown in FIG. 15. In this configuration, the light emitting diode LED consisting in the configuration of the optical regenerative oscillator as shown in FIG. 14 is attached in parallel with another photo-detector PD' into which the controlling external input light Pi is injected, so that the start and the stop of the above mentioned regenerative oscillation can be controlled. Besides, for the configuration as shown in FIG. 15, it can be easily comprehended that the hysteresis performance can be recognized between the input light Pi and the output light Po as it is, and hence the optical bistable function device can be realized.

As is apparent from the described above, in the optical function semiconductor device according to the present invention, which is composed on the basis of the combination of the light emitting diode and the photo-detector which are circularly interconnected optically and electrically, two stable states caused in the output light thereof can be controlled in response to the intensity of the external light injected thereinto, so that, apart from the conventional optical bistable device as mentioned earlier, the light source itself which is contained in the device is provided with the bistability controlling performance. As a result, the device according to the present invention is not required at all to be provided with any external light source for attaining the desired functions, for instance, another light emitting diode or a semiconductor laser device attached thereto, so that the miniaturization, the simplification, the low power consumption and further the economization of the whole device can be remarkably promoted. In addition, since the basic configuration thereof is extremely simple, it is possible to realize various kinds of novel optical function devices such as an optical multivibrator by variously combining optical and electrical feedback systems and further to expect excellent performances, for instance, the high density and the high response speed by optically integrating.

That is to say, according to the optical bistability caused between the light input and output of the optical function semiconductor device of the present invention, the hysteresis performance can be obtained, as well as other desired performances, for instance, the differential gain performance, the limiter performance can be readily realized by appropriately setting up the operating condition thereof. As a result, various kinds of novel optical functions, for instance, the optical switch, the optical memory, the optical logic, the optical differential amplification, the optical pulse shaper, the optical output discrimination, the optical clipper, the optical limiter and the optical pulse generator can be realized by utilizing those novel performances. Particularly, it is ready to form the whole device in a unitary structure with a high density by integrating in the monolithic or hibrid type all of the light emitting diode and the photo-detector and further electronic circuit elements connected therebetween.

Principal functions or function devices of various kinds to which the optical function semiconductor device of the present invention can be applied as mentioned above will be enumerated as follows.
(i) An optical computer device, for instance, an optical digital memory and an optical calculator
(ii) An optical pulse shaper
(iii) An optical amplifier (an optical triode)
(iv) An optical pulse discriminator
(v) An optical limiter
(vi) An optical repeater for optical digital communication
(vii) An optical pulse generator In addition thereto, since the optical function semiconductor device according to the present invention is composed by combining the light emitting diode and the photo-detector, the integration of which has been already facilitated, it is extremely easier to integrate the device of the present invention than the conventional integrated optical bistable device.

For instance, the conventional optical bistable device which employs a waveguide type photo-modulator consisting of $LiNO_3$ requires such sizes as a few or a dozen or so mm, whilst the device of the present invention can be sufficiently miniaturized in size of, for instance, hundreds $\mu m$. Besides, the condition required for the controlling external input light is determined only by the photo-detector, so that the device of the present invention can be used in a wide range of wavelength at low input light intensity, and further it is not required to use the coherent light for the control. In addition, since the indispensable light source is contained therein, the practical utility thereof is extremely high and further the benfit such as various operation modes can be electrically controlled is provided. Consequently, the device according to the present invention can be expected to be vigorously utilized as one of basic devices employed in various systems, for instance, the optical communication, the optical data processing and the like in the immediate future.

What is claimed is:
1. An optical function semiconductor device comprising:
   a light emitting element and an opto-electrical converting element, both of which consist of semiconductors, said light emitting element and said opto-electrical converting element being circularly interconnected optically and electrically;
   a controlling semiconductor means for controlling respective input-to-output performances of said light emitting element and said opto-electrical converting element;

the output light of said light emitting element being controlled through said controlling semiconductor means by the electric output of said opto-electrical converting element, said electric output being generated in response to at least the internal incidence of a portion of said output light of said light emitting element; and whereby the relationship between the incident light on said opto-electrical converting element and said output light of said light emitting element is determined by said respective input-to-output performances controlled through said controlling semiconductor means.

2. An optical function semiconductor device as claimed in claim 1, wherein said controlling semiconductor means comprises a biasing resistive means for biasing said opto-electrical converting element and an amplifier means for amplifying said electric output of said opto-electrical converting element to be applied to said light emitting element.

3. An optical function semiconductor device as claimed in claim 1, wherein said output light of said light emitting element is controlled by said controlling semiconductor means in accordance with said electric output of said opto-electrical converting element which is generated in response to the incidence of an external light input thereon together with said internal incidence of said portion of said output light of said light emitting element.

4. An optical function semiconductor device as claimed in claim 3, wherein a hysteresis effect is noted by the relationship between said external incident light input to said opto-electrical converting element and said output light of said light emitting element due to the collaborative combination of said respective input-to-output performances of said light emitting element and said opto-electrical converting element and based upon the intersection at one point of the respective input-to-output performance curves thereof.

5. An optical function semiconductor device as claimed in claim 3, wherein one of a differential gain performance or a limiter performance is noted by the relationship between said external incident light of said opto-electrical converting element and said output light of said light emitting element due to the collaborative combination of said respective input-to-output performances of said light emitting element and said opto-electrical converting element and based upon the intersection at two points of the input-to-output performance curves thereof.

6. An optical function semiconductor device as claimed in claim 1, wherein one of the light emitting surfaces of said light emitting element and one of the light incident surfaces of said opto-electrical converting element face each other on a common semiconductor substrate.

7. An optical function semiconductor device as claimed in claim 3, wherein one of the light emitting surfaces of said light emitting element and one of the light incident surfaces of said opto-electrical converting element face each other on a common semiconductor substrate.

* * * * *